United States Patent
Ivanov et al.

(10) Patent No.: US 8,482,317 B2
(45) Date of Patent: Jul. 9, 2013

(54) COMPARATOR AND METHOD WITH ADJUSTABLE SPEED AND POWER CONSUMPTION

(75) Inventors: Vadim V. Ivanov, Tucson, AZ (US);
Harish Venkataraman, Wylie, TX (US);
Daniel A. King, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 215 days.

(21) Appl. No.: 13/134,762

(22) Filed: Jun. 16, 2011

(65) Prior Publication Data
US 2012/0319736 A1    Dec. 20, 2012

(51) Int. Cl.
*H03K 19/082* (2006.01)
(52) U.S. Cl.
USPC .............................................. 327/76; 327/54
(58) Field of Classification Search
USPC ............... 327/50–53, 63–66, 68–74, 76–78, 327/80, 81, 530–550
See application file for complete search history.

(56) References Cited

U.S. PATENT DOCUMENTS

| | | | |
|---|---|---|---|
| 7,382,180 B2* | 6/2008 | Chen | 327/543 |
| 7,973,587 B2* | 7/2011 | Yang et al. | 327/359 |
| 8,081,015 B2* | 12/2011 | Ha | 327/54 |

* cited by examiner

*Primary Examiner* — Lincoln Donovan
*Assistant Examiner* — Diana J Cheng
(74) *Attorney, Agent, or Firm* — Alan A. R. Cooper; Wade J. Brady III; Frederick J. Telecky, Jr.

(57) ABSTRACT

A comparator (10) includes a first input transistor (M0) having a drain coupled to a gate and drain of a first diode-connected transistor (M2) and a gate of a first current mirror output transistor (M4), and a second input transistor (M1) having a drain coupled to a gate and drain of a second diode-connected transistor (M3) and a gate of a second current mirror output transistor (M5). Sources of the first and second current mirror output transistors are connected to a supply voltage ($V_{DD}$). Gates of the first and second input transistors are coupled to first ($V_{IN}^-$) and second ($V_{IN}^+$) input signals, respectively. Sources of the first and second diode-connected transistors are coupled to drains of the first and second current mirror output transistors, respectively. A latch circuit (M8, M9) is coupled to the drains of the first and second current mirror output transistors.

20 Claims, 4 Drawing Sheets

COMPARATOR AND METHOD WITH ADJUSTABLE SPEED AND POWER CONSUMPTION

BACKGROUND OF THE INVENTION

The present invention relates generally to integrated circuit comparators, and more particularly to ways of reducing average power consumption of high-speed comparators, and still more particularly to comparators including circuitry for adjusting comparator speed/propagation delay and comparator power consumption according to external system needs.

High speed (i.e., low signal propagation delay) of a comparator in a system may need to be adjusted according to the present operation requirements of the system. For example, the error comparator of a current mode DC-to-DC converter needs to be fast (e.g., with a propagation delay of 10-20 nanoseconds) when a power switch is ON, but the propagation delay may be 10-1000 times greater when the power switch is OFF. Reducing the power consumption of the comparator during time intervals when high speed (i.e., low propagation delay) is not needed may provide a substantial decrease in overall power consumption of a system containing comparators.

Figure 1:
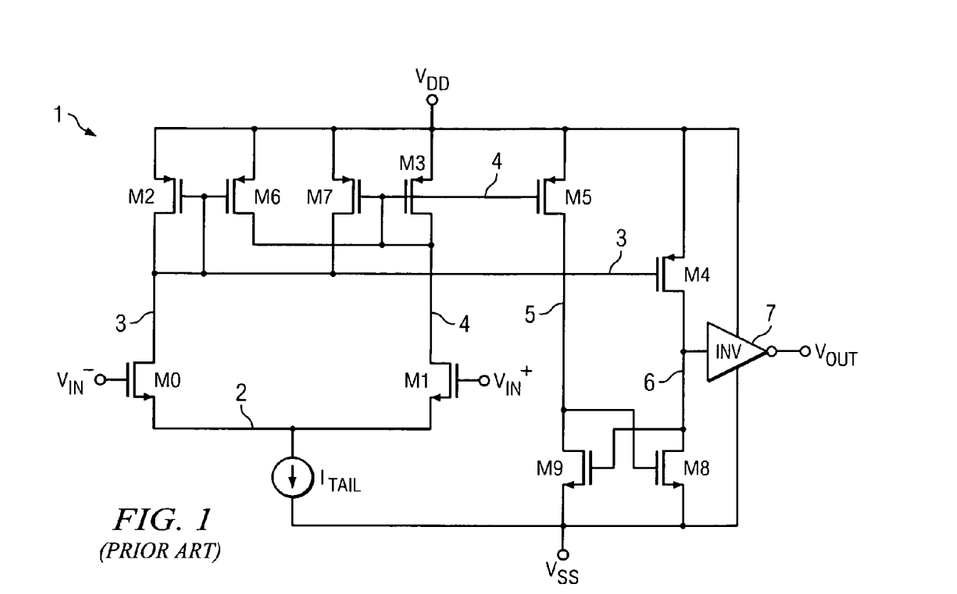
FIG. 1 is a schematic diagram of a conventional high-speed integrated circuit comparator.

"Prior Art" FIG. 1 shows a comparator 1 that includes a differential input stage including N-channel input transistors M0 and M1 having their sources connected by conductor 2 to one terminal of a tail current source $I_{TAIL}$, the other terminal of which is connected to $V_{SS}$. The gates of transistors M0 and M1 are coupled to input signals $V_{IN}^-$ and $V_{IN}^+$, respectively. The drain of input transistor M0 is connected by conductor 3 to the drain and gate of a P-channel load transistor M2, the gate of a P-channel "hysteresis" transistor M6, the drain of a P-channel "hysteresis" transistor M7, and the gate of a P-channel current mirror output transistor M4. The sources of transistors M2, M6, M7, and M4 are connected to $V_{DD}$. Similarly, the drain of input transistor M1 is connected by conductor 4 to the drain and gate of a P-channel load transistor M3, the gate of P-channel "hysteresis" transistor M7, the drain of P-channel "hysteresis" transistor M6, and the gate of a P-channel current mirror output transistor M5. The source of transistor M5 is connected to $V_{DD}$.

Diode-connected load transistor M2 functions as the input transistor of a first current mirror that also includes output transistor M4, and diode-connected load transistor M3 functions as the input transistor of a second current mirror that also includes output transistor M5. These two current mirrors form a second stage of comparator 1. The drain of current mirror output transistor M4 is connected by conductor 6 to the input of an output inverter or buffer 7, the drain of a N-channel transistor M8, and the gate of a N-channel transistor M9. The sources of transistors M8 and M9 are connected to $V_{SS}$. Similarly, the drain of current mirror output transistor M5 is connected by conductor 5 to the drain of N-channel transistor M9 and the gate of N-channel transistor M8. Current mirror output transistors M4 and M5 and transistors M8 and M9 form a latch circuit that operates to latch the desired state of comparator 1. The circuitry including transistors M8 and M9 may be thought of as a third stage of comparator 1.

Transistors M6 and M7 provide hysteresis for comparator 1 in response to local positive feedback for hysteresis provided by latch transistors M8 and M9. For low current consumption, the third stage including latch transistors M8 and M9 latches the desired state of comparator 1. As a result, the quiescent current (Iq) of comparator 1 is equal to the tail current $I_{TAIL}$ of the input differential input stage including input transistors M0 and M1. (Comparator 1 in Prior Art FIG. 1 alternatively is sometimes implemented with transistors M8 and M9 functioning as a conventional current mirror utilized as a pair of load devices rather than as a latch circuit. The current mirror could include transistor M9 connected as a current mirror input transistor and transistor M8 connected as a current mirror output transistor. However, such a current mirror consumes twice as much current as the above described latch circuit M8/M9 because the current mirror input transistor and current mirror output transistor each conducts an amount of current equal to the tail current $I_{TAIL}$.)

The above-mentioned hysteresis may be provided to avoid multiple parasitic switching of comparator 1. The input-referred hysteresis of comparator 1 is equal to $2V_{th} \ln(N)$, where $V_{th}=kT/q$ and N is the "area ratio" M2/M6=M3/M7, where M2/M6 represents the ratio of the W/L ratio of transistor M2 divided by the W/L ratio of transistor M6 (where "W" and "L" are the channel-width and channel-length, respectively, of the field effect transistor). Differentially coupled MOS input transistors M0 and M1 may be operated in their weak inversion regions to improve the power-speed ratio of the differential input stage.

The speed of comparator 1 is directly proportional to its tail current $I_{TAIL}$, or, stated differently, the propagation delay of comparator 1 is inversely proportional to $I_{TAIL}$. Comparator 1 in FIG. 1 typically has a high power-to-speed ratio, and its propagation delay is dominated by the amount of time required to charge the parasitic input capacitance of the second stage with the current produced by differential input stage M0/M1, and therefore is inversely proportional to $I_{TAIL}$. The parasitic input capacitance of the second stage mainly includes the gate capacitances of current mirror output transistors M4 and M5.

The value of tail current $I_{TAIL}$ needs to be sufficiently high to ensure that the currents of current mirrors M2/M4 and M3/M5 are capable of switching the latch including transistors M8 and M9. Consequently, the minimum value of $I_{TAIL}$ is undesirably large for some applications, and therefore the variable range of the quiescent current (Iq) of comparator 1 is undesirably small. $I_{TAIL}$ needs to be sufficiently large to cause current mirror input transistors M2 or M3 to mirror enough current through current mirror output transistor M4 or M5, respectively, to overpower whichever of transistors M8 and M9 is presently turned on in order to cause the above mentioned latch circuit to switch to its opposite state. Transistors M4 and M5 therefore must be very large transistors in order to deliver that much current, and therefore must have large gate capacitances. The required large gate capacitances of current mirror output transistors M4 and M5 undesirably limit the achievable speed/propagation delay of comparator 1 of Prior Art FIG. 1.

A certain amount of hysteresis usually is desirable in a comparator. One way to obtain hysteresis in comparator 1 is by means of above-mentioned transistors M6 and M7. The amount of hysteresis is determined by the area ratio of transistors M3 and M7, which is the same as the area ratio of transistors M2 and M6. The amount of hysteresis is determined by positive feedback, so latch circuit M8/M9 will not switch from its present state to its opposite state until the drain current of one of input transistors M0 and M1 increases sufficiently and the drain current of the other input transistor decreases sufficiently. Because of the positive feedback, latch circuit M8/M9 can not switch its state until the ratio of the drain currents in transistors M3 and M7 is such that they can "overpower" the current mismatch caused by the positive feedback that is determined by the area ratio of transistors M3 and M7. (The two foregoing ratios need to be kept nearly constant in order to prevent latch circuit M8/M9 from switching states.)

For example, if $V_{IN}^+$ increases relative to $V_{IN}^-$ so that there is a particular amount of current in input transistor M1 and the same amount of current flows in current mirror output transistor M3, it means that input transistor M0 provides less current than hysteresis transistor M7 (assuming hysteresis transistor M7 is matched to current mirror reference transistor M3). Comparator 1 will not able to switch to its opposite state because transistor M7 in effect short-circuits the gate of current mirror input transistor M2 to $V_{DD}$. Therefore, there is no current in transistor M6, the current flow being through transistors M3 and M7. Consequently, latch circuit M8/M9 can switch state only if the amount of current in transistor M0 exceeds the current in transistor M7. Transistors M3 and M7 may be ratioed so as to cause more current to flow through input transistor M0, thereby turning on current mirror reference transistor M2 by increasing the ratio of the current in transistor M0 to the current in transistor M1. This is because the ratio of the current in current mirror reference transistor M3 to the current in hysteresis transistor M7, which also is the ratio of the current in current mirror reference transistor M2 to the current in hysteresis transistor M6, determines the ratio of the currents in input transistors M0 and M1 at the times at which switching of latch M8/M9 occurs, thereby resulting in input-related voltage hysteresis in comparator 1.

It would be highly desirable to keep current mirror output transistors M4 and M5 small to minimize the amount of capacitance that must be charged proportionately to tail current $I_{TAIL}$ and thereby achieve a low comparator propagation delay while also maintaining a low power consumption of the comparator, but unfortunately comparator 1 of Prior Art FIG. 1 does not permit this to be accomplished. Comparator 1 of Prior Art FIG. 1 inherently requires that current mirror output transistors M4 and M5 be able to generate relatively large currents in order to switch the state of latch M4,M5. Consequently, a relatively large minimum value of $I_{TAIL}$ is required, and therefore comparator 1 consumes a relatively large amount of current and power.

Thus, there is an unmet need for a comparator capable of "on the fly" adjustment of both comparator speed/propagation delay and comparator power consumption according to system needs.

There also is an unmet need for a comparator capable of switching and latching its state without requiring a large tail current source in a differential input stage of the comparator.

There also is an unmet need for a comparator which is capable of "on the fly" adjustment of both comparator speed/propagation delay and comparator power consumption according to system needs and which also is capable of switching and latching the state of the comparator without requiring a large tail current source in a differential input stage of the comparator.

There also is an unmet need for a comparator configuration that is optimal or near-optimal for a wide range of applications.

There also is an unmet need for a comparator configuration which requires very little design effort to adapt it for a wide range of applications.

SUMMARY OF THE INVENTION

It is an object of the invention to provide a comparator that is capable of high-speed operation when needed and which also consumes very little power when high-speed operation is not required.

It is another object of the invention to provide a comparator and method capable of "on the fly" adjustment of both comparator speed/propagation delay and comparator power consumption according to system needs during normal operation.

It is another object of the invention to provide a comparator capable of switching and latching its state without requiring a large tail current source in a differential input stage of the comparator.

It is another object of the invention to provide a comparator which is capable of "on the fly" adjustment of both comparator speed/propagation delay and comparator power consumption according to system needs and which also is capable of switching the state of the comparator without requiring a large tail current source in a differential input stage of the comparator.

It is another object of the invention to provide a comparator configuration that is optimal or near-optimal for a wide range of applications.

It is another object of the invention to provide a comparator configuration which requires very little design effort to adapt it for a wide range of applications.

Briefly described, and in accordance with one embodiment, the present invention provides a comparator (10) including a first input transistor (M0) having a drain coupled to a gate and drain of a first diode-connected transistor (M2) and a gate of a first current mirror output transistor (M4), and a second input transistor (M1) having a drain coupled to a gate and drain of a second diode-connected transistor (M3) and a gate of a second current mirror output transistor (M5). Sources of the first and second current mirror output transistors are connected to a supply voltage ($V_{DD}$). Gates of the first and second input transistors are coupled to first ($V_{IN}^-$) and second ($V_{IN}^+$) input signals, respectively. The sources of the first and second diode-connected transistors are coupled to the drains of the first and second current mirror output transistors, respectively. A latch circuit (M8,M9) is coupled to the drains of the first and second current mirror output transistors.

In one embodiment, the invention provides a comparator (10) including an input stage (M0/M1) including first (M0) and second (M1) input transistors, a first current mirror (M2/M4) coupled to the first input transistor (M0), and a second current mirror (M3/M5) coupled to the second input transistor (M1). The first current mirror (M2/M4) includes a first diode-connected transistor (M2) and a first current mirror output transistor (M4), and the second current mirror (M3, M5) includes a second diode-connected transistor (M3) and a second current mirror output transistor (M5). Each of the first (M0) and second (M1) input transistors, the first (M2) and second (M3) diode-connected transistors, and the first (M4) and second (M5) current mirror output transistors has a source, a drain, and a gate. The sources of the first (M0) and second (M1) input transistors are coupled to a first reference voltage ($V_{SS}$). The gates of the first (M0) and second (M1) input transistors are coupled to first ($V_{IN}^-$) and second ($V_{IN}^+$) input signals, respectively. The drain of the first input transistor (M0) is coupled to the drain and the gate of the first diode-connected transistor (M2) and the gate of the first current mirror output transistor (M4), and the drain of the second input transistor (M1) is coupled to the drain and the gate of the second diode-connected transistor (M3) and the gate of the second current mirror output transistor (M5). The sources of the first (M4) and second (M5) current mirror output transistors are coupled to a second reference voltage ($V_{DD}$). The sources of the first (M2) and second (M3) diode-connected transistors are coupled to the drains of the first (M4) and second (M5) current mirror output transistors, respectively. A latch circuit (M8,M9) is coupled to the drains of the first (M4) and second (M5) current mirror output transistors.

In a described embodiment, the input stage (M0,M1) is a differential input stage including a current source ($I_{TAIL}$). The latch circuit includes a first latch transistor (M8) having a drain coupled to the drain of the first current mirror output transistor (M4), a source coupled to the first reference voltage ($V_{SS}$), and a gate coupled to the drain of the second current mirror output transistor (M5). The latch circuit also includes a second latch transistor (M9) having a drain coupled to the drain of the second current mirror output transistor (M5), a source coupled to the first reference voltage ($V_{SS}$), and a gate coupled to the drain of the first current mirror output transistor (M4).

In one embodiment, the comparator (10) includes a first hysteresis transistor (M6) having a source coupled to the second reference voltage ($V_{DD}$), a gate coupled to the gate of the first diode-connected transistor (M2), and a drain coupled to the drain of the second input transistor (M1), and also includes a second hysteresis transistor (M7) having a source coupled to the second reference voltage ($V_{DD}$), a gate coupled to the gate of the second diode-connected transistor (M3), and a drain coupled to the drain of the first input transistor (M0).

In a described embodiment, the current source ($I_{TAIL}$) has a value which results in a predetermined delay of the comparator (10). The first (M4) and second (M5) current mirror output transistors have a channel-width-to-channel-length ratio that is substantially less than a channel-width-to-channel-length ratio of the first (M0) and second (M1) input transistors. The first (M0) and second (M1) input transistors, the first (M2) and second (M3) diode-connected transistors, and the first (M4) and second (M5) current mirror output transistors have channel-width-to-channel-length ratios selected to ensure switching of the latch circuit when the current source ($I_{TAIL}$) has a predetermined low value.

In a described embodiment, the first diode-connected transistor (M2) becomes reverse biased during a part of a comparator switching cycle so as to prevent it from limiting the gate-to-source voltage of the first current mirror output transistor (M4), and the second diode-connected transistor (M3) becomes reverse biased during a part of another comparator switching cycle so as to prevent it from limiting the gate-to-source voltage of the second current mirror output transistor (M5).

In a described embodiment, first (M0) and second (M1) input transistors are N-channel transistors, wherein the first (M2) and second (M3) diode-connected transistors, the first (M4) and second (M5) current mirror output transistors, and the first (M6) and second (M7) hysteresis transistors are P-channel transistors. The first (M8) and second (M9) latch transistors are N-channel transistors.

In a described embodiment, the drain of the first input transistor (M0) is directly coupled to the drain of the first diode-connected transistor (M2), and the drain of the second input transistor (M1) is directly coupled to the drain of the second diode-connected transistor (M3).

In one embodiment, the invention provides a method for reducing power consumption in a comparator (10) including an input stage (M0/M1) having first (M0) and second (M1) input transistors, the method including coupling sources of the first (M0) and second (M1) input transistors to a first reference voltage ($V_{SS}$); coupling a gate of each of the first (M0) and second (M1) input transistors to first ($V_{IN}^-$) and second ($V_{IN}^+$) input signals, respectively; coupling a drain of the first input transistor (M0) to a drain and a gate of a first diode-connected transistor (M2) and to a gate of a first current mirror output transistor (M4), and coupling a drain of the second input transistor (M1) to a drain and a gate of a second diode-connected transistor (M3) and to a gate of a second current mirror output transistor (M5); coupling sources of the first (M4) and second (M5) current mirror output transistors to a second reference voltage ($V_{DD}$); coupling sources of the first (M2) and second (M3) diode-connected transistors to drains of the first (M4) and second (M5) current mirror output transistors, respectively; and coupling the drains of the first (M4) and second (M5) current mirror output transistors to a latch circuit (M8,M9).

In one embodiment, the method includes reverse biasing the first (M2) or second (M3) diode-connected transistor during part of a comparator switching cycle so as to prevent that diode-connected transistor from limiting a gate-to-source voltage of the first (M4) or second (M5) current mirror output transistor, respectively.

In one embodiment, the method includes coupling a drain of a first latch transistor (M8) in the latch circuit (M8,M9) to the drain of the first current mirror output transistor (M4), coupling a source of the first latch transistor (M8) to the first reference voltage ($V_{SS}$), and coupling a gate of the first latch transistor (M8) to the drain of the second current mirror output transistor (M5), the method also including coupling a drain of a second latch transistor (M9) in the latch circuit (M8,M9) to the drain of the second current mirror output transistor (M5), coupling a source of the second latch transistor (M9) to the first reference voltage ($V_{SS}$), and coupling a gate of the second latch transistor (M9) to the drain of the first current mirror output transistor (M4).

In one embodiment, the method includes providing channel-width-to-channel-length ratios of the first (M0) and second (M1) input transistors, the first (M2) and second (M3) diode-connected transistors, and the first (M4) and second (M5) current mirror output transistors so as to ensure switching of the first (M8) and second (M9) latch transistors when the current source ($I_{TAIL}$) has a predetermined low value.

In one embodiment, the comparator (10) includes a first hysteresis transistor (M6) having a source coupled to a second reference voltage ($V_{DD}$), a gate coupled to the gate of the first diode-connected transistor (M2), and a drain coupled to the drain of the second input transistor (M1), and also includes a second hysteresis transistor (M7) having a source coupled to the second reference voltage ($V_{DD}$), a gate coupled to the gate of the second diode-connected transistor (M3), and a drain coupled to the drain of the first input transistor (M0), wherein the method includes providing a channel-width-to-channel-length ratio of the first (M6) and second (M7) hysteresis transistors so as to provide a predetermined amount of hysteresis for the comparator (10).

In one embodiment, the method includes coupling the drain of the first input transistor (M0) directly to the drain and the gate of the first diode-connected transistor (M2) and to the gate of the first current mirror output transistor (M4), and coupling the drain of the second input transistor (M1) directly to the drain and the gate of the second diode-connected transistor (M3) and to the gate of the second current mirror output transistor (M5).

In one embodiment, the invention provides a comparator (10) including circuitry for reducing power consumption, including a differential input stage (M0/M1) having first (M0) and second (M1) input transistors and a current source ($I_{TAIL}$), a gate of each of the first (M0) and second (M1) input transistors being coupled to first ($V_{IN}^-$) and second ($V_{IN}^+$) input signals, respectively; means (2) for coupling sources of the first (M0) and second (M1) input transistors to the current source ($I_{TAIL}$); means (3) for coupling a drain of the first input transistor (M0) to a drain and a gate of a first diode-connected transistor (M2) and to a gate of a first current mirror output transistor (M4); means (4) for coupling a drain of the second input transistor (M1) to a drain and a gate of a second diode-connected transistor (M3) and to a gate of a second current mirror output transistor (M5); means for coupling sources of the first (M4) and second (M5) current mirror output transistors to a first reference voltage ($V_{DD}$); means (3,4) for coupling sources of the first (M2) and second (M3) diode-connected transistors to the drains of the first (M4) and second (M5) current mirror output transistors, respectively; and means (5,6) for coupling the drains of the first (M4) and second (M5) current mirror output transistors to a latch circuit (15).

DETAILED DESCRIPTION OF THE PREFERRED EMBODIMENTS

Figure 2:
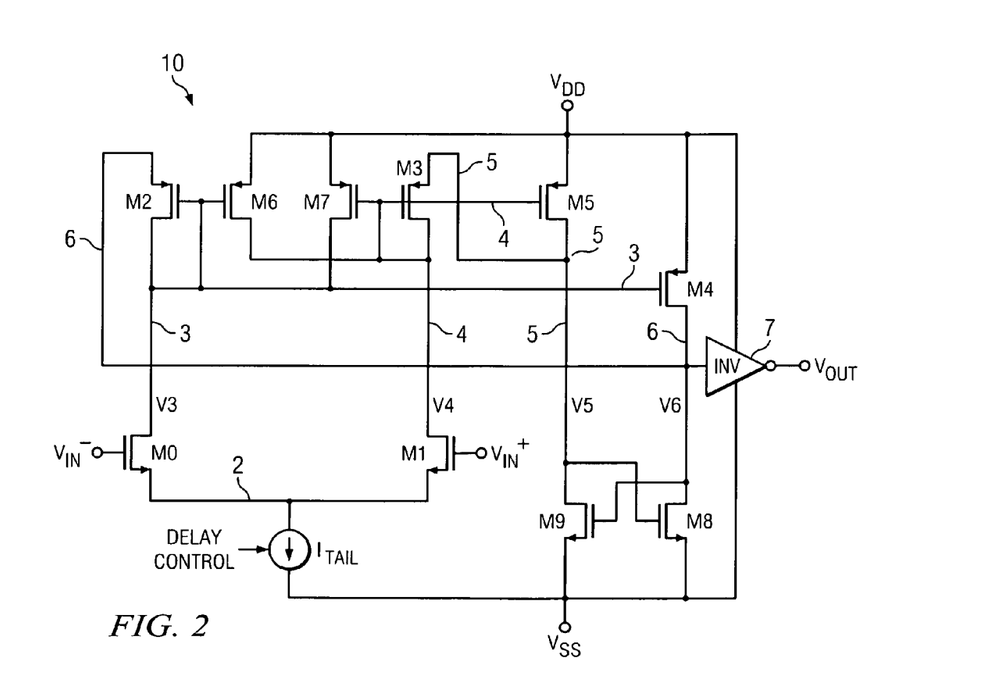
FIG. 2 is a schematic diagram of a high speed comparator in accordance with the present invention.

FIG. 2 shows a high speed comparator 10 including an input stage with N-channel input transistors M0 and M1 having their sources connected by conductor 2 to one terminal of a current source $I_{TAIL}$, the other terminal of which is connected to $V_{SS}$. The gates of transistors M0 and M1 are coupled to input signals $V_{In}^-$ and $V_{IN}^+$, respectively. The drain of input transistor M0 is connected by conductor 3 to the drain and gate of a diode-connected P-channel "current mirror reference transistor" M2, the gate of a P-channel "hysteresis" transistor M6, the drain of a P-channel "hysteresis" transistor M7, and the gate of a P-channel current mirror output transistor M4. The source of diode-connected current mirror reference transistor M2 is connected to a conductor 6 (instead of to $V_{DD}$ as in Prior Art FIG. 1). The sources of transistors M6 and M7 are connected to $V_{DD}$. Similarly, the drain of input transistor M1 is connected by conductor 4 to the drain and gate of a diode-connected P-channel current mirror reference transistor M3, the gate of P-channel "hysteresis" transistor M7, the drain of P-channel "hysteresis" transistor M6, and the gate of a P-channel current mirror output transistor M5. The source of current mirror reference transistor M3 is connected to a conductor 5 (instead of to $V_{DD}$ as in Prior Art FIG. 1). The source of transistor M5 is connected to $V_{DD}$. The voltages V3, V4, V5, and V6 appear on conductors 3, 4, 5, and 6, respectively.

Current mirror output transistors M4 and M5 may be very small, with sizes almost as small as minimum-size transistors for the integrated circuit manufacturing process being utilized. The small sizes of current mirror output transistors M4 and M5 result in them having low gate capacitances which can be driven at high speed with very small values of tail current $I_{TAIL}$, so as to provide very low signal propagation delay of comparator 10.

Current mirror reference transistor M2 functions part of the time as the input transistor of a current mirror that also includes output transistor M4, and diode-connected current mirror reference transistor M3 functions part of the time as the input transistor of another current mirror that also includes output transistor M5. At other times, diode-connected current mirror reference transistors M2 and M3 are reverse biased, and therefore are functionally disconnected from conductors 6 and 5, respectively. The drain of current mirror output transistor M4 is connected by conductor 6 to the input of an output inverter or buffer 7, the drain of a N-channel latch transistor M8, and the gate of a N-channel latch transistor M9. The sources of latch transistors M8 and M9 are connected to $V_{SS}$. Similarly, the drain of current mirror output transistor M5 is connected by conductor 5 to the drain of latch transistor M9 and the gate of latch transistor M8. Current mirror output transistors M4 and M5, along with latch transistors M8 and M9, form a latch circuit M8/M9.

Although input transistors M0 and M1 and tail current source $I_{TAIL}$ are illustrated as a differential input stage, a different kind of input stage could be used. For example, the sources of the input transistors could be connected to $V_{SS}$. However, in this case the range of the input voltages $V_{IN}^+$ and $V_{IN}^-$ would be quite limited. It should be understood that different kinds of coupling of input transistors M0 and M1 to diode-connected transistors M2 and M3, respectively, could be used, for example to provide more voltage "headroom".

Hysteresis transistor M6 creates positive feedback, the amount of which depends on the ratio of the effective W/L ratio of diode-connected transistor M2 in series with current mirror output transistor M4 to the W/L ratio of hysteresis transistor M6. The larger the W/L ratio of hysteresis transistor M6, the larger the percentage of hysteresis of comparator circuit 10 will be. The W/L ratio of hysteresis transistor M6 may be less than, equal to, or greater than that of diode-connected M2. Similarly, hysteresis transistor M7 creates positive feedback, the amount of which depends on the ratio of the effective W/L ratio of diode-connected transistor M3 in series with current mirror output transistor M5 to the W/L ratio of hysteresis transistor M7.

The unacceptably large minimum current consumption limitation of comparator 1 in Prior Art FIG. 1 is avoided by comparator circuit 10 in FIG. 2. This is achieved by the connecting of the sources of current mirror reference transistors M2 and M3 to the outputs of the two current mirrors M2/M4 and M3/M5, respectively. This prevents negative feedback around each current mirror from occurring until latch circuit M8/M9 switches state and current mirror output transistor M4 or M5 starts operating in its triode region, in which case current mirror reference transistor M2 and current mirror output transistor M4 in effect form a diode-connected, long-channel transistor.

Consequently, the gate-source voltages of current mirror output transistors M4 and M5 during a comparator switching operation are not limited by the diode-connected current mirror reference transistors, as is the case for comparator 1 of Prior Art FIG. 1. Instead, in comparator 10 of FIG. 2 the gate-source voltages of current mirror output transistors M4 and M5 can be as high as needed to provide suitably large currents in current mirror output transistors M4 and M5 to switch the state of latch circuit M8/M9. In one case, if transistors M8 and M9 initially are on and off, respectively, input transistor M0 can pull the voltage V3 on conductor 3 low enough to turn current mirror output transistor M4 fully on. Then transistor M4 can deliver a sufficiently large current to overcome or exceed the current in latch transistor M8 during its "on" condition and also turn latch transistor M9 on, thereby switching comparator 10 to its opposite state. Similarly, if comparator 10 initially is in its opposite state in which transistors M8 and M9 initially are off and on, respectively, input transistor M1 can pull the voltage V4 on conductor 4 low enough to turn current mirror output transistor M5 fully on. Then transistor M5 can deliver a sufficiently large current to overcome or exceed the "on" condition of latch transistor M9 and turn latch transistor M8 on, thereby switching comparator 10 to its opposite state.

Following is an example of the operation of latch circuit 10 in FIG. 2. If latch transistor M8 is on and latch transistor M9 is off, and if $V_{IN}^-$ suddenly becomes less than $V_{IN}^+$ and transistor M4 is in its triode region of operation (so that it functions as a resistor), then diode-connected transistor M2 and current mirror output transistor M4 are connected in series (because the drain of transistor M4 is connected to the source of current mirror reference transistor M2 and their gates are connected together). The current in input transistor M0 flows through the drain and source of diode-connected transistor M2 and through the drain and source of current mirror output transistor M4. Diode-connected transistor M2 initially functions as a current mirror reference transistor and substantially limits the gate-to-source voltage of current mirror output transistor M4. However, at the instant the drain voltage V6 of current mirror output transistor M4 becomes significantly less than $V_{DD}$, diode-connected transistor M2 becomes functionally disconnected from the gate of current mirror output transistor M4 and consequently no longer limits the gate-to-source voltage of transistor M4. Therefore, input transistor M0 causes V3 to go to a sufficiently low level to fully turn on current mirror output transistor M4 so it can deliver a current substantially larger than the current in latch transistor M8, which presently is turned on. This causes the voltage V6 on conductor 6 to rapidly rise and turn on latch transistor M9, thereby switching latch circuit M8/M9, and hence comparator 10, to its opposite state.

Figure 2A:
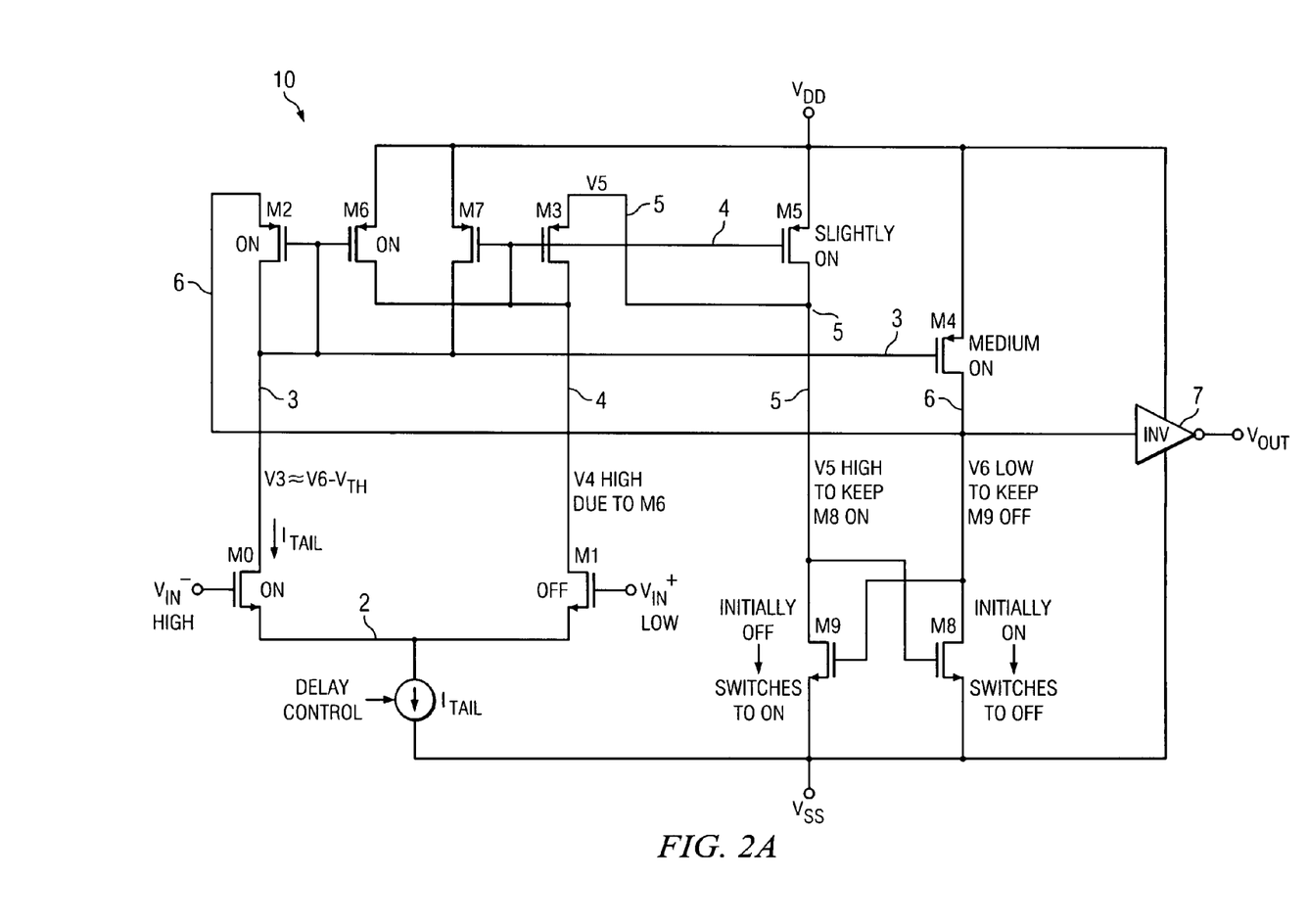
FIG. 2A is a replica of FIG. 2 including notations to indicate the comparator circuit operating configuration during waveform segments A1 of the $V_{IN}^-$ waveform and B1 of the $V_{IN}^+$ waveform in FIG. 3.
Figure 3:
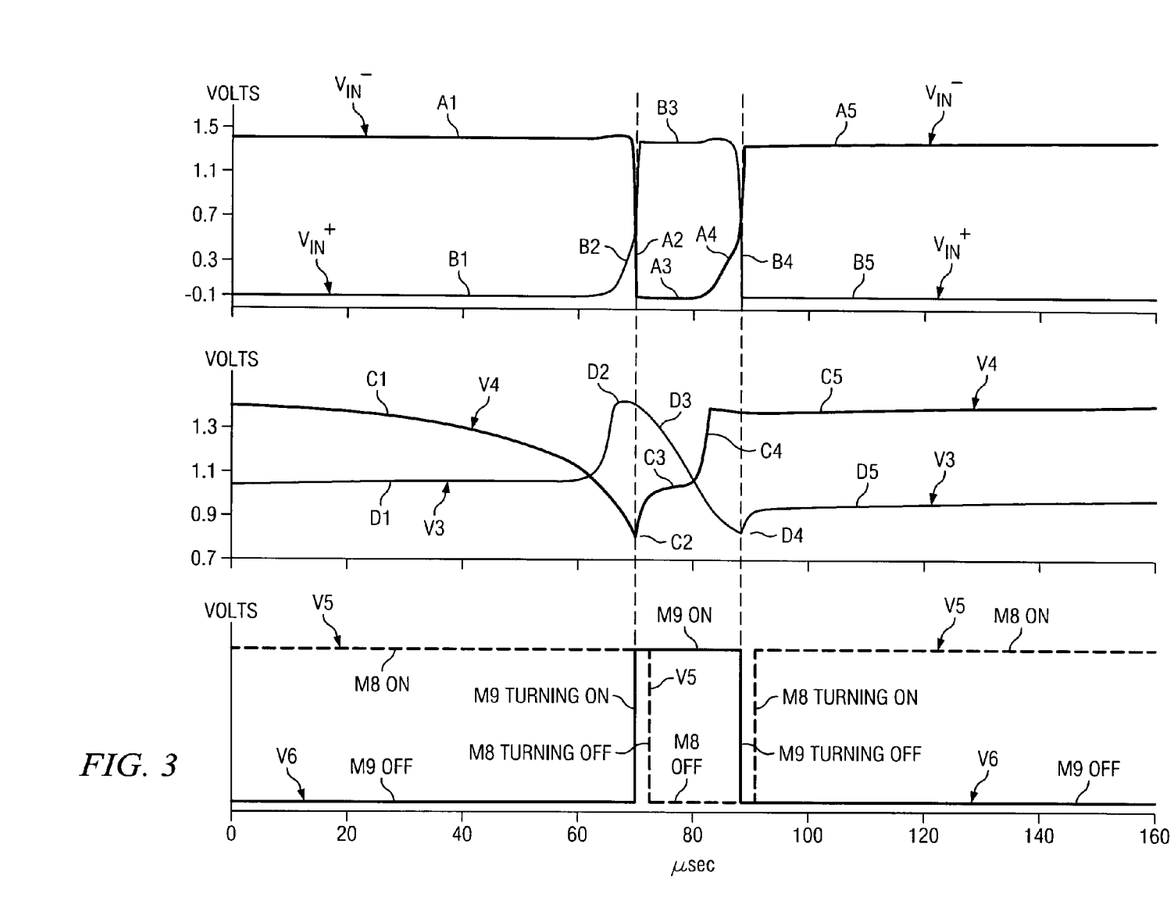
FIG. 3 is a timing diagram showing several simulated waveforms of the comparator of FIG. 2.

FIG. 2A provides additional notations to FIG. 2 to indicate the operation of comparator circuit 10 during waveform segment A1 of the $V_{IN}^-$ waveform and segment B1 of the $V_{IN}^+$ waveform in FIG. 3 if latch transistor M8 is initially ON and latch transistor M9 is initially OFF. Referring to FIGS. 2A and 3, during segments A1 and B1, $V_{IN}^-$ is at a high level and input transistor M0 is ON. $V_{IN}^+$ is at a low level and input transistor M1 is OFF or nearly OFF. Therefore, tail current $I_{TAIL}$ flows in input transistor M0, causing V3 to be one MOS threshold voltage $V_{TH}$ below V6. V3 is at a sufficiently low level to keep P-channel diode-connected transistor M2, hysteresis transistor M6, and current mirror output transistor M4 in their ON conditions. $V_{IN}^+$ is at a relatively low level, so very little, if any, current flows through input transistor M1. Hysteresis transistor M6 is ON and maintains its drain voltage V4 at a sufficiently high level to keep current mirror output transistor M5 sufficiently ON to cause V5 to be at a sufficiently high level to keep latch transistor M8 ON. This keeps V6 at a sufficiently low level to keep latch transistor M9 OFF. Current mirror output transistor M4 is sufficiently ON to cause V6 to be at a sufficiently high level to keep diode-connected transistor M2 in its ON condition.

When segment A2 of the $V_{IN}^-$ waveform and segment B2 of the $V_{IN}^+$ waveform in FIG. 3 occur, latch transistor M8 is switched from its initial ON state to its OFF state, and latch transistor M9 is switched from its initial OFF state to its ON state. $V_{IN}^-$ going high as mentioned above causes V3 to go low. This turns current mirror output transistor M4 ON harder, causing V6 to increase enough to turn latch transistor M9 ON. That causes V5 to go sufficiently low to turn latch transistor M8 OFF. It should be noted that during this switching operation, diode-connected transistor M2 goes into its OFF condition and therefore does not limit the gate-to-source voltage of current mirror output transistor M4. That is what allows current mirror output transistor M4 to be able to deliver enough current to increase V6 sufficiently to turn on latch transistor M9.

Figure 2B:
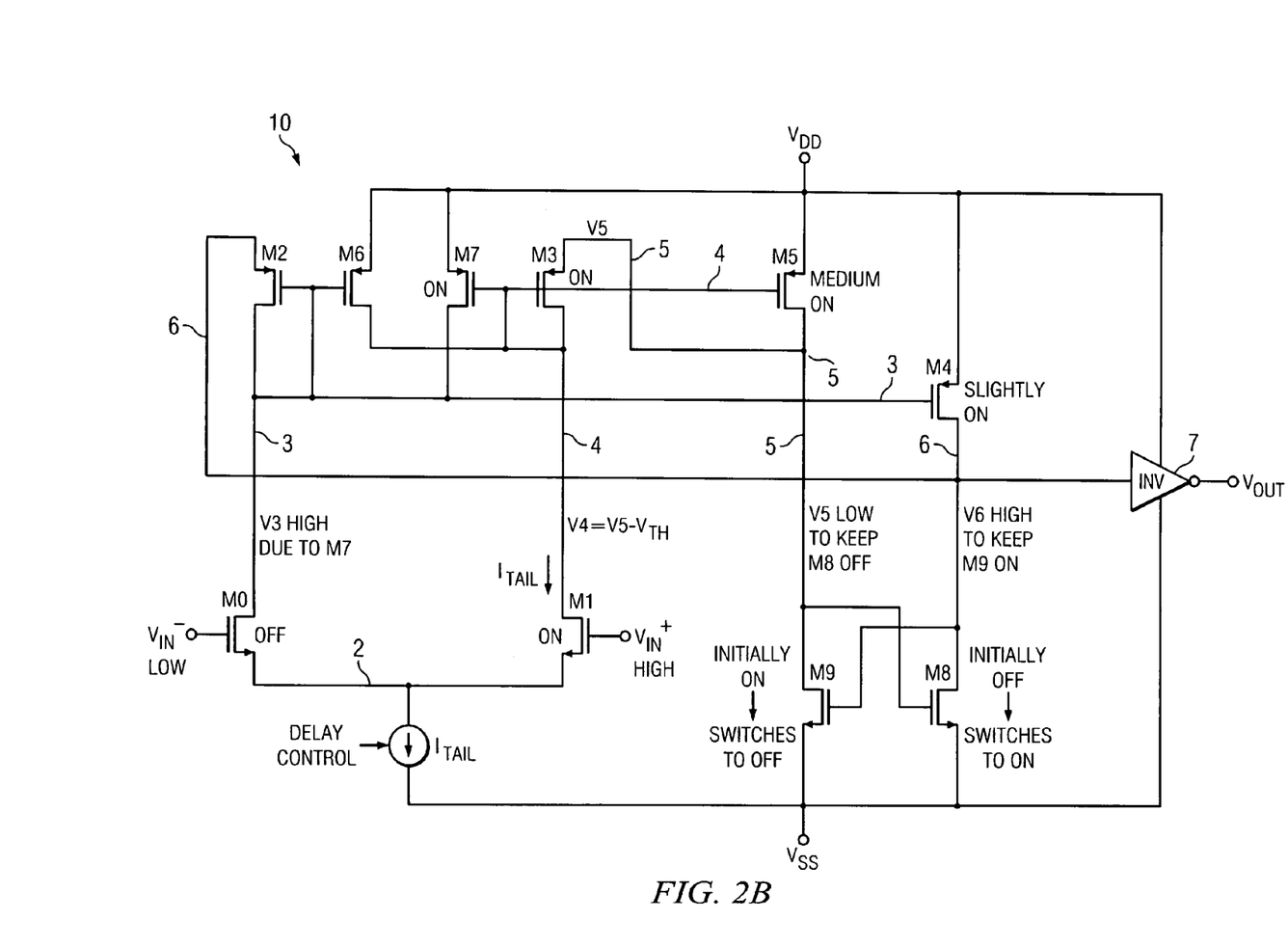
FIG. 2B is a replica of FIG. 2 including notations to indicate the comparator circuit operating configuration during waveform segments A3 of the $V_{IN}^-$ waveform and B3 of the $V_{IN}^+$ waveform in FIG. 3.

Similarly, FIG. 2B provides appropriate additional notations to FIG. 2 to indicate the operation of comparator circuit 10 during waveform segment A3 of the $V_{IN}^-$ waveform and segment B3 of the $V_{IN}^+$ waveform in FIG. 3 if latch transistor M8 is initially OFF and latch transistor M9 is initially ON. Referring to FIGS. 2B and 3, during segments A3 and B3, $V_{IN}^-$ is at a low level and transistor M0 is OFF or nearly OFF. $V_{IN}^+$ is at a high level and input transistor M1 is ON. Therefore, tail current $I_{TAIL}$ flows in input transistor M1, causing V4 to be a threshold voltage $V_{TH}$ lower than V5. V4 is at a sufficiently low level to keep diode-connected transistor M3, hysteresis transistor M7, and current mirror output transistor M4 ON. $V_{IN}^-$ is at a relatively low level, so very little, if any, current flows through input transistor M0. Hysteresis transistor M7 is ON and maintains its drain voltage V3 at a sufficiently high level to keep current mirror output transistor M4 sufficiently ON to cause V4 to be at a sufficiently high level to keep latch transistor M9 ON. This keeps V5 at a sufficiently low level to keep latch transistor M8 OFF. Current mirror output transistor M5 is sufficiently ON to cause V5 to be at a sufficiently high level to keep diode-connected transistor M3 in its ON condition.

When segment A4 of the $V_{IN}^-$ waveform and segment B4 of the $V_{IN}^+$ waveform in FIG. 3 occur, latch transistor M9 is switched from its initial ON state to its OFF state, and latch transistor M8 is switched from its initial OFF state to its ON state. $V_{IN}^+$ going high causes V4 to go low. This turns current mirror output transistor M5 ON harder, causing V5 to increase enough to turn latch transistor M8 ON. That causes V6 to go sufficiently low to turn latch transistor M9 OFF. It should be noted that during this switching operation, diode-connected transistor M3 goes into its OFF condition and therefore does not limit the gate-to-source voltage of current mirror output transistor M5. That is what allows current mirror output transistor M5 to be able to deliver enough current to increase V5 sufficiently to turn on latch transistor M8.

Thus, the times at which diode-connected transistors M2 and M3 are turned on and off depend on the states of latch transistors M8 and M9, that is, on whether V5 or V6 is higher. During any switching of the states of latch transistors M8 and M9 to their opposite states, one or the other of diode-connected transistors M2 or M3 becomes reverse biased.

The hysteresis of comparator 10 in FIG. 2 is determined in accordance with the previously mentioned formula $2V_{TH}$ ln(N) for comparator 1 in Prior Art FIG. 1. For comparator 10 of FIG. 2, however, N is the area ratio of the W/L of current mirror reference transistor M2 divided by an effective W/L ratio of the series connection of transistors M6 and M4. Also, N is the area ratio of the W/L of current mirror reference transistor M3 divided by an effective W/L ratio of the series connection of transistors M7 and M5.

The value of tail current $I_{TAIL}$ mainly affects the speed or propagation delay of comparator 10, and is not important with respect to its functionality. Comparator 10 of FIG. 2 allows the value of tail current $I_{TAIL}$ to be increased by as much as a factor of roughly 1000 times greater than its minimum value in order to decrease the comparator propagation delay. In one implementation, the value of tail current $I_{TAIL}$ can be from 2 nanoamperes to 5 microamperes.

Latch circuit M8/M9 can always switch its stored state reliably, and the value of $I_{TAIL}$ nevertheless can be adjusted whenever needed to provide very fast, short propagation delays, and also can be adjusted whenever needed to provide very low power consumption during time intervals in which large comparator propagation delays are acceptable. Comparator 10 of FIG. 2 requires large amounts of power only when a system in which comparator 10 is included requires very short comparator propagation delay. During other time intervals in which high-speed comparator performance is not required, comparator 10 consumes much less power. For example, if the error amplifier output in a buck converter is small, a comparator 10 therein could have a very long propagation delay during which a tail current $I_{TAIL}$ of 2 or 3 nanoamperes may be adequate voltage may be adequate. However, a very short time later the error amplifier output might be much larger and the same comparator may need to have a much shorter propagation delay, e.g. 5 to 10 nanoseconds, which would require a much larger value of tail current $I_{TAIL}$.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A comparator comprising:
   (a) an input stage including first and second input transistors;
   (b) a first current mirror coupled to the first input transistor and a second current mirror coupled to the second input transistor, the first current mirror including a first diode-connected transistor and a first current mirror output transistor, the second current mirror including a second diode-connected transistor and a second current mirror output transistor;
   (c) each of the first and second input transistors, the first and second diode-connected transistors, and the first and second current mirror output transistors having a source, a drain, and a gate, the sources of the first and second input transistors being coupled to a first reference voltage, the gates of the first and second input transistors being coupled to first and second input signals, respectively, the drain of the first input transistor being coupled to the drain and the gate of the first diode-connected transistor and the gate of the first current mirror output transistor, the drain of the second input transistor being coupled to the drain and the gate of the second diode-connected transistor and the gate of the second current mirror output transistor, the sources of the first and second current mirror output transistors being coupled to a second reference voltage, and the sources of the first and second diode-connected transistors being coupled to the drains of the first and second current mirror output transistors, respectively; and
   (d) a latch circuit coupled to the drains of the first and second current mirror output transistors.

2. The comparator of claim 1 wherein the input stage is a differential input stage including a current source.

3. The comparator of claim 2 wherein the latch circuit includes a first latch transistor having a drain coupled to the drain of the first current mirror output transistor, a source coupled to the first reference voltage, and a gate coupled to the drain of the second current mirror output transistor, and also includes a second latch transistor having a drain coupled to the drain of the second current mirror output transistor, a source coupled to the first reference voltage, and a gate coupled to the drain of the first current mirror output transistor.

4. The comparator of claim 3 including a buffer circuit having an input coupled to the drain of the first current mirror output transistor.

5. The comparator of claim 3 including a first hysteresis transistor having a source coupled to the second reference voltage, a gate coupled to the gate of the first diode-connected transistor, and a drain coupled to the drain of the second input transistor, and also including a second hysteresis transistor having a source coupled to the second reference voltage, a gate coupled to the gate of the second diode-connected transistor, and a drain coupled to the drain of the first input transistor.

6. The comparator of claim 2 wherein the current source has a value which results in a predetermined delay of the comparator.

7. The comparator of claim 2 wherein the first and second current mirror output transistors have a channel-width-to-channel-length ratio that is substantially less than a channel-width-to-channel-length ratio of the first and second input transistors.

8. The comparator of claim 3 wherein the first and second input transistors, the first and second diode-connected transistors, and the first and second current mirror output transistors have channel-width-to-channel-length ratios, respectively, that ensure switching of the latch circuit when the current source has a predetermined low value.

9. The comparator of claim 8 wherein the tail current source has a value in the range from approximately 2 nanoamperes to 5 microamperes.

10. The comparator of claim 2 wherein the first diode-connected transistor becomes reverse biased during a part of a comparator switching cycle so as to prevent the first diode-connected transistor from limiting a gate-to-source voltage of the first current mirror output transistor, and wherein the second diode-connected transistor becomes reverse biased during a part of another comparator switching cycle so as to prevent the second diode-connected transistor from limiting a gate-to-source voltage of the second current mirror output transistor.

11. The comparator of claim 5 wherein the first and second input transistors are N-channel transistors, and wherein the first and second diode-connected transistors, the first and second current mirror output transistors, and first and second hysteresis transistors are P-channel transistors.

12. The comparator of claim 11 wherein the first and second latch transistors are N-channel transistors.

13. The comparator of claim 1 wherein the drain of the first input transistor is directly coupled to the drain of the first diode-connected transistor, and wherein the drain of the second input transistor is directly coupled to the drain of the second diode-connected transistor.

14. A method for reducing power consumption in a comparator including an input stage having first and second input transistors, the method comprising:
   (a) coupling sources of the first and second input transistors to a first reference voltage;
   (b) coupling a gate of each of the first and second input transistors to first and second input signals, respectively;
   (c) coupling a drain of the first input transistor to a drain and a gate of a first diode-connected transistor and to a gate of a first current mirror output transistor, and coupling a drain of the second input transistor to a drain and a gate of a second diode-connected transistor and to a gate of a second current mirror output transistor;

(d) coupling sources of the first and second current mirror output transistors to a second reference voltage;

(e) coupling sources of the first and second diode-connected transistors to drains of the first and second current mirror output transistors, respectively; and (f) coupling the drains of the first and second current mirror output transistors to a latch circuit.

15. The method of claim 14 including reverse biasing the first or second diode-connected transistor during part of a comparator switching cycle so as to prevent that diode-connected transistor from limiting a gate-to-source voltage of the first or second current mirror output transistor, respectively.

16. The method of claim 14 including coupling a drain of a first latch transistor in the latch circuit to the drain of the first current mirror output transistor, coupling a source of the first latch transistor to the first reference voltage, and coupling a gate of the first latch transistor to the drain of the second current mirror output transistor, the method also including coupling a drain of a second latch transistor in the latch circuit to the drain of the second current mirror output transistor, coupling a source of the second latch transistor to the first reference voltage, and coupling a gate of the second latch transistor to the drain of the first current mirror output transistor.

17. The method of claim 16 including providing channel-width-to-channel-length ratios of the first and second input transistors, the first and second diode-connected transistors, and the first and second current mirror output transistors so as to ensure switching of the first and second latch transistors when the current source has a predetermined low value.

18. The method of claim 16 wherein the comparator includes a first hysteresis transistor having a source coupled to the second reference voltage, a gate coupled to the gate of the first diode-connected transistor, and a drain coupled to the drain of the second input transistor, and also includes a second hysteresis transistor having a source coupled to the second reference voltage, a gate coupled to the gate of the second diode-connected transistor, and a drain coupled to the drain of the first input transistor, the method including providing channel-width-to-channel-length ratios of the first and second hysteresis transistors so as to provide a predetermined amount of hysteresis for the comparator.

19. The method of claim 14 wherein step (c) includes coupling the drain of the first input transistor directly to the drain and the gate of the first diode-connected transistor and to the gate of the first current mirror output transistor, and coupling the drain of the second input transistor directly to the drain and the gate of the second diode-connected transistor and to the gate of the second current mirror output transistor.

20. A comparator including circuitry for reducing power consumption, including a differential input stage having first and second input transistors and a current source, gates of the first and second input transistors being coupled to first and second input signals, respectively, the comparator comprising:

(a) means for coupling sources of the first and second input transistors to a first reference voltage;

(b) means for coupling a drain of the first input transistor to a drain and a gate of a first diode-connected transistor and to a gate of a first current mirror output transistor, and means for coupling a drain of the second input transistor to a drain and a gate of a second diode-connected transistor and to a gate of a second current mirror output transistor;

(c) means for coupling sources of the first and second current mirror output transistors to a second reference voltage;

(d) means for coupling sources of the first and second diode-connected transistors to drains of the first and second current mirror output transistors, respectively; and (e) means for coupling the drains of the first and second current mirror output transistors to a latch circuit.

* * * * *